United States Patent
Thompson

(10) Patent No.: US 7,565,586 B2
(45) Date of Patent: Jul. 21, 2009

(54) METHOD AND APPARATUS FOR LATENT FAULT MEMORY SCRUB IN MEMORY INTENSIVE COMPUTER HARDWARE

(75) Inventor: Steven R. Thompson, Phoenix, AZ (US)

(73) Assignee: Honeywell International Inc., Morristown, NJ (US)

( * ) Notice: Subject to any disclaimer, the term of this patent is extended or adjusted under 35 U.S.C. 154(b) by 546 days.

(21) Appl. No.: 11/440,520

(22) Filed: May 25, 2006

(65) Prior Publication Data

US 2008/0002513 A1    Jan. 3, 2008

(51) Int. Cl.
*G11C 29/00* (2006.01)
*G01R 31/28* (2006.01)

(52) U.S. Cl. .................. 714/718; 714/719; 714/724; 365/201

(58) Field of Classification Search .................. None
See application file for complete search history.

(56) References Cited

U.S. PATENT DOCUMENTS

| | | | |
|---|---|---|---|
| 3,863,227 A * | 1/1975 | Sanabria ................. 714/719 |
| 4,130,241 A | 12/1978 | Meredith et al. | |
| 5,488,583 A * | 1/1996 | Ong et al. ................ 365/201 |
| 5,561,671 A * | 10/1996 | Akiyama ................. 714/799 |
| 5,784,323 A * | 7/1998 | Adams et al. ........... 365/201 |
| 2005/0018519 A1 | 1/2005 | Nii | |
| 2005/0276113 A1 | 12/2005 | Nakayama et al. | |

FOREIGN PATENT DOCUMENTS

GB    1284506    8/1972

OTHER PUBLICATIONS

European Search Report for Application No. 07108806.6, mailed on Dec. 22, 2008.

* cited by examiner

*Primary Examiner*—John P Trimmings
*Assistant Examiner*—Guerrier Merant
(74) *Attorney, Agent, or Firm*—Ingrassia Fisher & Lorenz, P.C.

(57) ABSTRACT

A method for operating a memory checker in a command monitoring architecture comprising at least two processing lanes comprises a first step of receiving a command to activate a first test mode. The first test mode comprises an initial step of inverting data read from a memory and inverting data written to the memory. Next, it is determined if there is a match between data associated with a first processing lane and retrieved by a second checker logic associated with a second processing lane and with data associated with a second processing lane and retrieved by a first checker logic associated with the first processing lane. A failure in the memory is determined if there is no match.

19 Claims, 3 Drawing Sheets

METHOD AND APPARATUS FOR LATENT FAULT MEMORY SCRUB IN MEMORY INTENSIVE COMPUTER HARDWARE

FIELD OF THE INVENTION

The present invention relates to the field of computer hardware and, more specifically, to a method and apparatus for latent fault memory scrub in memory intensive computer hardware.

BACKGROUND OF THE INVENTION

In many applications it is important that a proper command is generated in response to command inputs. Therefore, various ways to check that a given command was generated correctly in response to command inputs have been developed. One way to help ensure proper commands are generated is to use hardware command monitors that can be used to check the output of a logic device that generates the commands. These self-checking architectures can be implemented in several ways. In one embodiment, two processing lanes are provided. Each processing lane includes a command generating logic device and a comparison logic device. The command generating device in each processing lane receives the same command requests and generates a command from those requests. The command generated by each command logic device is sent to the comparison logic device in the opposite processing lane, to verify the generated command is correct. If the output of both processing lanes is verified as correct, the commands can be used. If the commands do not match, the commands are discarded.

Command monitoring is implemented in many fields, including the avionics field. For example, a pilot may wish to bank the plane a certain amount and control the yoke of the aircraft a certain amount. The commands generated by the pilot's maneuvering of the yoke can be sent to a flight control system that will monitor the process to ensure the commands generated are correct. In some cases, such as in fly-by-wire systems, the commands may be generated by the flight control system. Therefore, it is desirable to verify the command generation process.

As command generating systems become more sophisticated, they may require memory, such as random access memory (RAM), to store data to and retrieve data from while generating commands. The self-checking hardware thus becomes dependent on the proper functioning of the RAM. It then becomes necessary to ensure the RAM is operating properly. One potential failure mode for RAM particularly troubling in self-checking architectures is a latent failure whereby specific bits in the memory cannot assume a specific state when required. The redundant nature of self-checking architectures makes it highly probable that faults are detected when they occur. However a latent failure can occur in RAM that usually receives the same data, such as a RAM where certain bits always take on the value of "0", except upon the occurrence of a rare operational condition or mode when the value needs to be a "1". If a failure has occurred in the memory such that the bit can't change from a "0", the fault may go unnoticed until that condition occurs. Thus, the latent memory failure renders the command generating system unavailable, potentially at a time most critical.

One way to detect latent RAM failure is through the use of built in testing (BIT) for memory. These tests typically read and write patterns to the memory to ensure each memory bit is operating properly. However, to develop BIT for memory in hardware based comparison systems that do not contain microprocessors can be complex.

Accordingly, it is desired to provide a method and apparatus for latent fault memory scrub in memory intensive computer hardware. Furthermore, the desirable features and characteristics of the present invention will be apparent from the subsequent detailed description and the appended claims, taken in conjunction with the accompanying drawings and the foregoing technical field and background.

BRIEF SUMMARY OF THE INVENTION

In one embodiment of the present invention a method for operating a memory checker in a command monitoring architecture comprising at least two processing lanes comprises a first step of receiving a command to activate a first test mode. The first test mode comprises an initial step of inverting data read from a memory and inverting data written to the memory. Next, it is determined if there is a match between data associated with a first processing lane and retrieved by a second checker logic associated with a second processing lane and with data associated with a second processing lane and retrieved by a first checker logic associated with a first processing lane. A failure in the memory is determined if there is no match.

In another embodiment, a logic device for use in a command monitoring situation comprises a command generating section configured to receive a common input and output a command. The logic device further comprises an inverting interface section coupled to the command generating section. The inverting interface section comprising a plurality of write inverters for inverting data prior to writing data to a memory, a plurality of read inverters for inverting data retrieved from the memory; and a control line for activating the write inverters and the read inverters.

In another embodiment, a command generating system utilizing command monitoring comprises a first processing lane. The first processing lane comprises a first command generating logic, a first memory coupled to the first command generating logic; and a first checker logic coupled to the first memory. The system also includes a second processing lane comprising a second command generating logic, a second memory coupled to the second command generating logic and a second checker logic coupled to the second memory. The system further includes a shared memory coupling the first checker logic and the second checker logic. In the system the first command generating logic is configured to invert data written to and read from the first memory, the second command generating logic is configured to invert data written to and read from the second memory, the first checker logic is configured to invert data written to and read from the first memory and the shared memory, and the second checker logic is configured to invert data written to and read from the second memory and the shared memory.

BRIEF DESCRIPTION OF THE DRAWINGS

The present invention will hereinafter be described in conjunction with the following drawing figures, wherein like numerals denote like elements, and.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
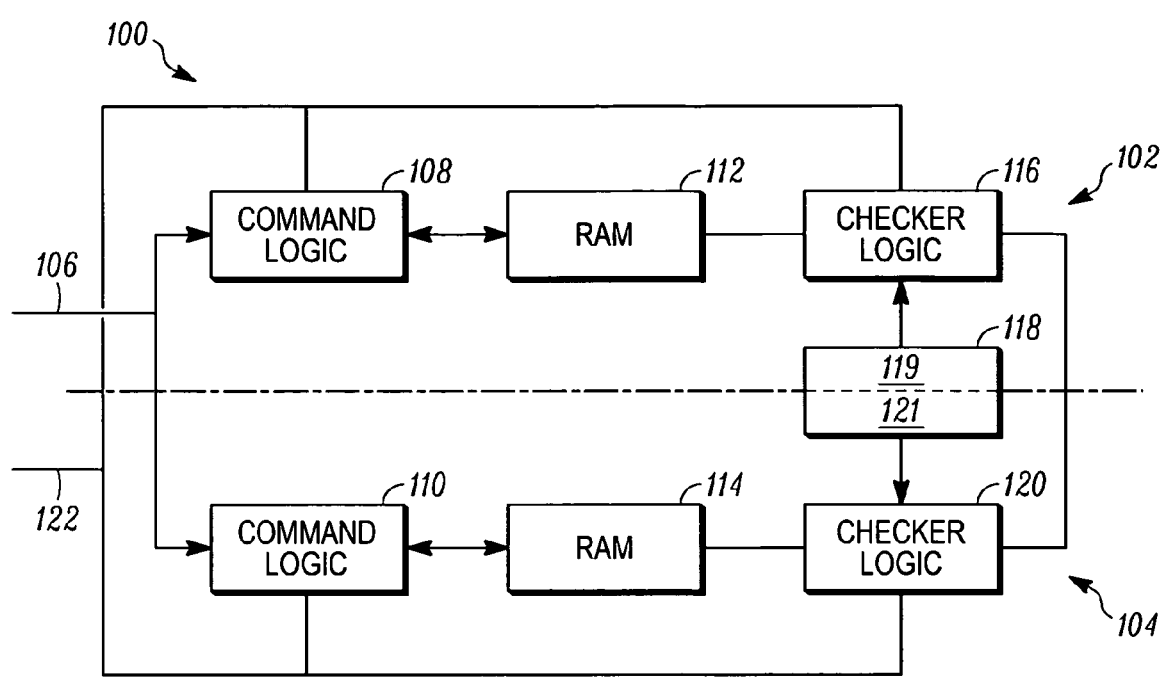
FIG. 1 illustrates an exemplary embodiment of a command generating device in accordance with the teachings of the present invention.

FIG. 1 illustrates an exemplary embodiment of a command generating device 100 utilizing hardware comparison architecture in accordance with the teachings of the present invention. Device 100 comprises a first processing lane 102 and a second processing lane 104. First processing lane 102 comprises a first command generating logic 108 coupled to a first random access memory (RAM) 112, which is coupled to a first checker logic 116. Second processing lane 104 comprises a second command generating logic 110 coupled to a second RAM 114, which is coupled to a second checker logic 120. A common input 106 is coupled to the first command generating logic 108 and the second command generating logic 110. An invert command line 122 is coupled to the first command generating logic 108, the second command generating logic 110, the first checker logic 116, and the second checker logic 120.

First command generating logic 108 and second command generating logic 110 receive inputs and produce outputs based on the received inputs. For example, in one exemplary embodiment, first command generating logic 108 and second command generating logic 110 receive inputs from common input 106 to generate commands. In an avionics embodiment, the inputs can be inputs generated by a pilot and the commands can be flight control commands such as commands to move one or more flight control surfaces, such as an aircraft aileron or rudder. First command generating logic 108 and second command generating logic 110 can be any one of numerous hardware logic devices such as application specific integrated circuits (ASICs), programmable logic devices (PLDs), field programmable gate arrays (FPGAs), state machines, and the like.

Figure 2:
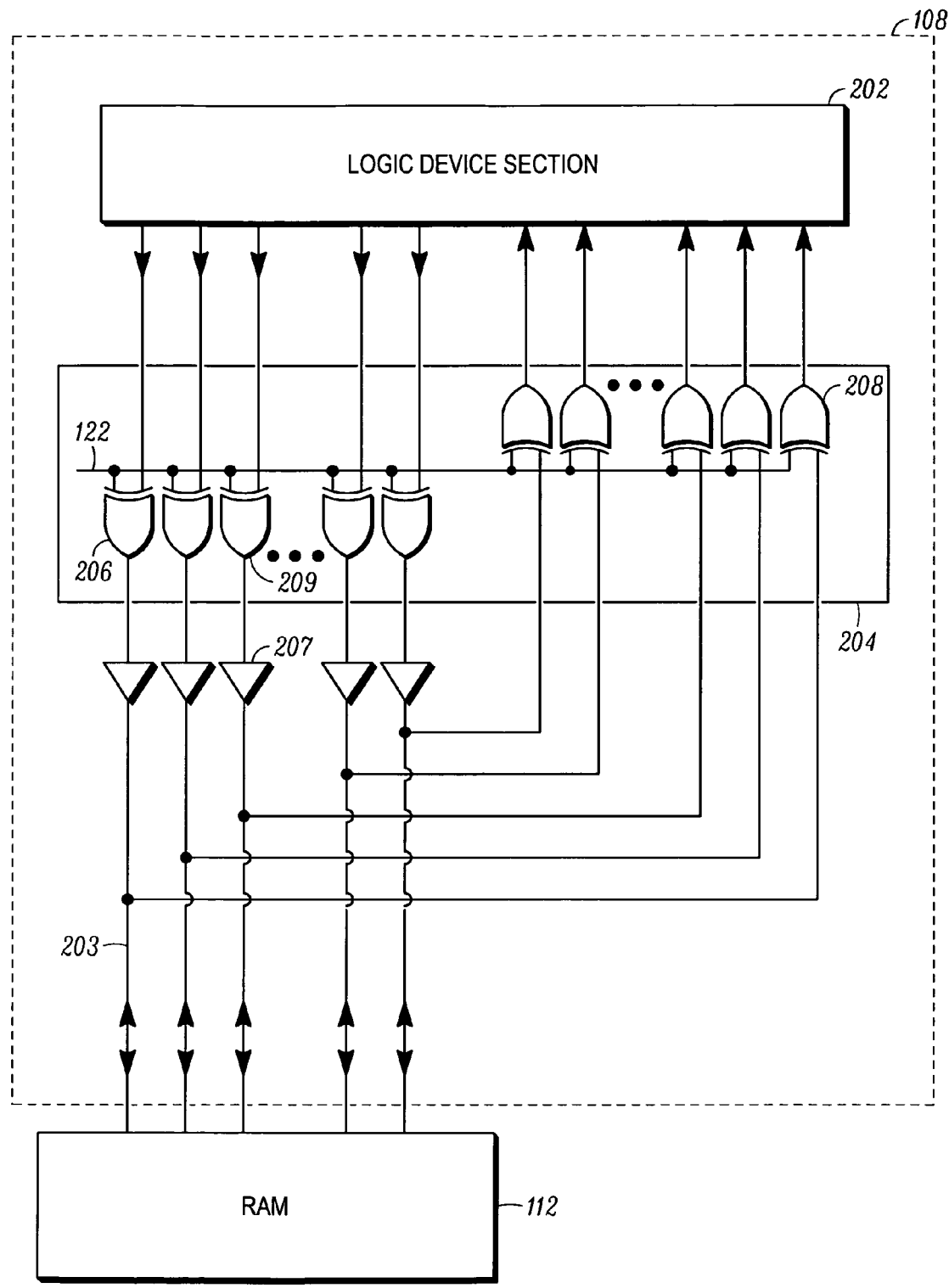
FIG. 2 is a block diagram of an exemplary embodiment of a command generating logic in accordance with the teachings of the present invention.

First command generating logic 108 and second command generating logic 110 also read and write data to first RAM 112 and second RAM 114, respectively, in the process of generating commands. In the present invention, additional structure can be added to first command generating logic 108 and second command generating logic 110. Turning to FIG. 2, a block diagram of first command generating logic 108 in accordance with the teachings of the present invention is depicted. First command generating logic 108 includes a logic device section 202 coupled to an inverter interface 204. First RAM 112 couples to the inverter interface 204.

Logic device section 202, in one exemplary embodiment, generates commands from common inputs 106. Additionally, logic device section 202 can act as a comparison logic device to compare generated commands or data.

Inverter interface 204 provides an interface between the logic device section 202 and first RAM 112. Inverter interface 204 includes a plurality of read/write data lines 203 coupled to logic writer inverters 206, logic writer drivers 207 and logic read inverters 208. Inverter interface 204 receives initial activation signals from invert command line 122 to activate the logic writer inverters 206 and logic read inverters 208. When activated, data to be written to first RAM 112 via read/write lines 203 is first inverted (typically by taking the ones complement) before being stored to RAM 112 using the logic writer drivers 207. This forces all cells in the first RAM 112 to take an opposite value as to what was being held in a previous state. If RAM 112 has a latent fault, such as the inability to hold a certain value, this inversion of the bit values can expose such an error to the architectures' checker logic.

When receiving the data from first RAM 112 via read/write lines 203 in the inverted mode, the value from the first RAM 112 is inverted prior to being sent to the logic device section 202. In the present invention, the logic device section 202 of first command generating logic 108 always uses non-inverted data and when the inverting process is activated, the logic device section 202 operates normally using non-inverted data.

While FIG. 2 has been described as an exemplary embodiment of first command generating logic 108, the same or similar situation can be used for second command generating logic 110, first checker logic 116 and second checker logic 120.

Figure 3:
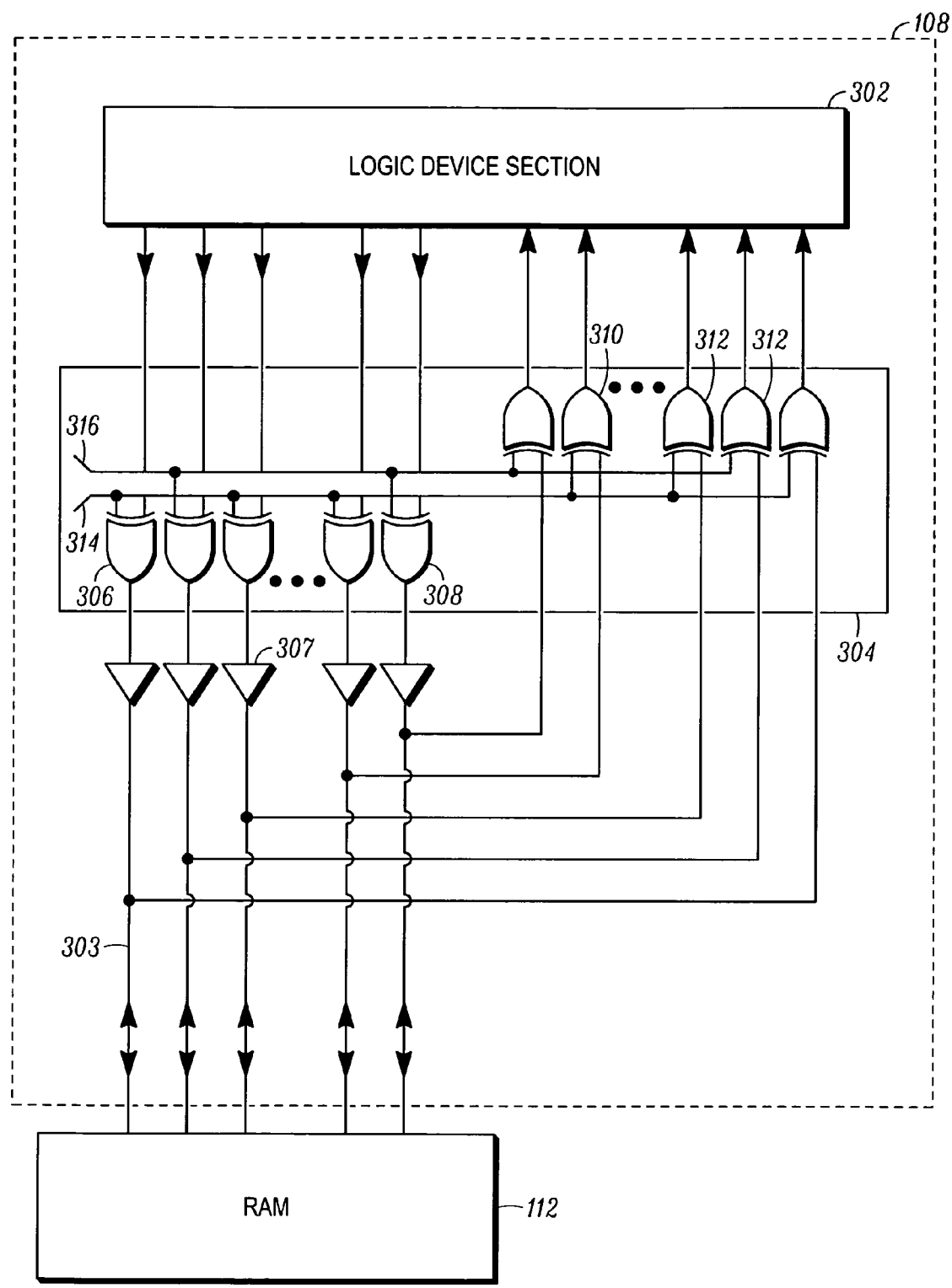
FIG. 3 is a block diagram of an alternative embodiment of a command generating logic in accordance with the teachings of the present invention.

FIG. 3 illustrates an alternative embodiment of first command generating logic 108. In this embodiment, first command generating logic 108 comprises a logic device section 302 and an inverter interface section 304.

Logic device section 302, in one exemplary embodiment, generates commands from common inputs 106. Additionally, logic device section 302 can act as a comparison logic device to compare generated commands or data.

The inverter interface 304 in this exemplary embodiment comprises a plurality of read/write data lines 303 that couple to an external memory and a first set of write inverters 306, a second set of write inverters 308, a first set of read inverters 310 and a second set of read inverters 312 coupled to the plurality of read/write data lines 303. First set of write inverters 306 and first set of read inverters 310 are coupled to a first logic control line 314. The second set of write inverters 308 and the second set of read inverters 312 are coupled to a second logic control line 316.

In this embodiment, instead of completely inverting all of the data sent to first RAM 112, only data for a particular set of bits is inverted. A purpose of this embodiment is to test for pattern dependent memory faults such as "bridge-faults" (wherein physically adjacent memory cells or control sense logic couples or bridges in behavior in another cell). For example, if the first set of write inverters 306 and the first set of read inverters 310 are coupled to only odd bits of first RAM 112, when the first logic control line 314 is activated, only the odd bits of first RAM 112 are inverted. When only the second logic control line 316 is activated, the second set of write inverters 308 and the second set of read inverters 312 are activated, which will invert the even bits written to and read from first RAM 112. When both the first logic control line 314 and the second logic control line 316 are activated, both the odd and even bits can be inverted. While FIG. 3 illustrates individual inversion of odd or even bits, additional control lines can be added to further divide which bits of first RAM 112 are inverted.

While FIG. 3 has been described as an exemplary embodiment of first command generating logic 108, the same or similar situation can be used for second command generating logic 110, first checker logic 116 and second checker logic 120.

Turning back to FIG. 1, first RAM 112 and second RAM 114 store data for use by the first command generating logic 108 and the second command generating logic 110. First RAM 112 and second RAM 114 can be any type of RAM as is well known in the art. In one exemplary embodiment, first RAM 112 and second RAM 114 can be integrated with first command generating logic 108 and second command generating logic 110, respectively.

First checker logic 116 and second checker logic 120 check, by comparison, the output of first command generating logic 108 and second command generating logic 110, respectively. In this embodiment, the first command generating logic 108 and second command generating logic 110 are coupled to the First checker logic 116 and second checker logic 120 (not pictured in FIG. 1). In one embodiment, the first checker logic 116 independently generates commands from common input 106. The first checker logic 116 then receives the output from the second command generating logic 110. First checker logic 116 then determines if the commands generated by the first checker logic 116 and the second command generating logic 110 match. Second checker logic 120 operates in a similar manner. If both the first checker logic 116 and the second checker logic 120 determine a match, the output can then be used. If not, the generated commands are discarded. First checker logic 116 and second checker logic 120 can be any one of numerous hardware logic devices such as an ASIC, FPGA, PLD, and the like, as is known in the art.

In the present invention, the first checker logic 116 and the second checker logic 120 can also be used to check first RAM 112 and second RAM 114 for latent errors. As discussed previously, when the first checker logic 116 and the second checker logic 120 receive an invert command from invert command line 122, the first checker logic 116 and second checker logic 120 will invert data before writing to first RAM 112 and second RAM 114 and will invert any data that is read from first RAM 112 and second RAM 114. In one exemplary embodiment, first checker logic 116 can read from first RAM 112 and write and read to shared memory 118 and second checker logic 120 can read from second RAM 114 and read and write to shared memory 118. As will be discussed in detail below, first checker logic 116 and second checker logic 120 can determine if there is a fault in first RAM 112 and second RAM 114.

Shared memory 118 is shared between first checker logic 116 and second checker logic 120. In one exemplary embodiment, shared memory 118 has a first portion 119 and a second portion 121. First checker logic 116 writes to one portion of shared memory 118 and the second checker logic 120 reads from that section and vice versa. The first portion 119 and the second portion 121 need not be physical memory portions, but rather denote the ability of a checker logic to read a value written by another checker logic. As before, shared memory 118 can be any type of RAM as is known in the art. Shared memory 118 may also be a shared register, buffer or other similar device.

In normal operation, command inputs are supplied via common input 106 to the first command generating logic 108 and the second command generating logic 110. The first command generating logic 108 and the second command generating logic 110 generate commands which can be checked by first checker logic 116 and second checker logic 120. During the command generating process, first command generating logic 108 and second command generating logic 110 can read or write to first RAM 112 and second RAM 114, respectively. For example, in one exemplary embodiment, during normal operation first command generating logic 108 and second command generating logic 110 will write and read a binary number, such as "1010", to first RAM 112 and second RAM 114.

Additionally, first checker logic 116 can read the contents of first RAM 112 and write that value to shared memory 118. Second checker logic 120 can read the contents of second RAM 114 and write that value to shared memory 118. First checker logic 116 can then read the data written by second checker logic 120, while second checker logic 120 will read the data written by first checker logic 116. Then, first checker logic 116 and second checker logic 120 can determine what data read from shared memory 118 matches the data read from first RAM 112 and second RAM 114. Therefore, for normal operation:

|  | Data generated by first and second command generating logic | Data as written to first and second RAM | Data as read by first and second checker logic | Data written to shared memory | Data read by checker logic across shared memory |
| --- | --- | --- | --- | --- | --- |
| Lane A | 1010 | 1010 | 1010 | 1010 | 1010 |
| Lane B | 1010 | 1010 | 1010 | 1010 | 1010 |

To check for errors, such as latent errors in RAM, an invert command is given, via invert command line 122. This causes the first command generating logic 108, the second command generating logic 110, the first checker logic 116, and the second checker logic 120 to invert the data prior to writing the data to the first RAM 112, the second RAM 114 and the shared memory 118 and to invert the data read from the first RAM 112, the second RAM 114 and the shared memory 118. Again, assuming that a "1010" is to be written to memory, when there is no error in either first RAM 112 or second RAM 114, the following table illustrates an example result:

|  | Data generated by first and second command generating logic | Data as written to first and second RAM | Data as read by first and second checker logic | Data written to shared memory | Data read by checker logic across shared memory |
| --- | --- | --- | --- | --- | --- |
| Invert A | 1010 | 0101 | 1010 | 0101 | 1010 |
| Invert B | 1010 | 0101 | 1010 | 0101 | 1010 |

Since the same value is sent by both first checker logic 116 and second checker logic 120 there is no error in the first RAM 112 and second RAM 114.

In the next example, it is assumed that there is a fault in the second RAM 114 such that the least significant bit is stuck at "0". Therefore, when the second command generating logic 110 attempts to write the inverted data to second RAM 114, a "0100" is written to second RAM 114 instead of "0101". The following table illustrates the detection of such an error:

|  | Data generated by first and second command generating logic | Data as written to first and second RAM | Data as read by first and second checker logic | Data written to shared memory | Data read by checker logic across shared memory |
| --- | --- | --- | --- | --- | --- |
| Invert A | 1010 | 0101 | 1010 | 0101 | 1011 |
| Invert B | 1010 | 0100 | 1011 | 0100 | 1010 |

Note, that since the first checker logic 116 reads the data written to the portion of the shared memory by second checker logic 120, the data read by the first checker logic 116 in this case is the "0100", which is inverted to "1011" before reaching the first checker logic 116. Since there was a mismatch at the first checker logic 116 and the second checker logic 120, an error exists in either first RAM 112 or second RAM 114.

In an exemplary embodiment, in order to check that the memory testing system is working properly, a single lane can be inverted to see if an error can be generated.

| | Data generated by first and second command generating logic | Data as written to first and second RAM | Data as read by first and second checker logic | Data written to shared memory | Data read by checker logic across shared memory |
|---|---|---|---|---|---|
| Invert A | 1010 | 0101 | 1010 | 0101 | 0101 |
| Non-invert B | 1010 | 1010 | 1010 | 1010 | 1010 |

Note, that when inversion is active for lane A, the first checker logic 116 reads the contents of the shared memory 118 as inverted data. This data was originally written by second checker logic 120, which was originally not inverted. Since the contents of the first checker logic 116 and the second checker logic 120 do not match, an error is detected. In this example, an error was expected since only one lane was inverted. Thus, the integrity of the memory checking system is verified.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

The invention claimed is:

1. A method for operating a memory checker in a command monitoring architecture comprising at least two processing lanes, the method comprising:
   receiving a command to activate a first test mode, the first test mode comprising:
      inverting data read from a memory and inverting data written to the memory;
      determining if there is a match between (i) a first set of data associated with a first processing lane and retrieved by a first checker logic that is also in communication with a second processing lane and (ii) a second set of data associated with the second processing lane and retrieved by a second checker logic that is also in communication with the first processing lane; and
      determining a fault in the memory if there is no match.

2. The method of claim 1 wherein the step of receiving a command to activate a first test mode further comprises activating an invert line coupled to logic devices in the memory checker.

3. The method of claim 1 wherein the step of inverting data read from a memory further comprises:

inverting and writing data to a first memory using a first command generating logic in the first processing lane;
inverting and writing data to a second memory using a second command generating logic in the second processing lane;
inverting and reading data stored in the first memory at the first checker logic;
inverting and writing data to a first portion of a shared memory using the first checker logic;
inverting and reading data stored in the second memory at the second checker logic;
inverting and writing data to a second portion of the shared memory using the second checker logic;
reading the second portion of the shared memory using the first checker logic; and
reading the first portion of the shared memory using the second checker logic.

4. The method of claim 1 further comprising the steps of:
   receiving a command to activate a second test mode;
   inverting data read from the memory and inverting data written to the memory in a subset of the at least two processing lanes; and
   receiving an error indicative of the proper operation of the memory checker when a first portion of the memory and a second portion of the memory fail to match.

5. The method of claim 1 wherein the step of inverting data read from a memory further comprises inverting a subset of data read from the memory and inverting a subset of data written to the memory.

6. A logic device for use in a command monitoring situation, the logic device comprising:
   a command generating section configured to receive an input in common with another command generating section and output a command; and
   an inverting interface section coupled to the command generating section, the inverting interface section comprising:
      a plurality of write inverters for inverting data prior to writing data to a memory;
      a plurality of read inverters for inverting data retrieved from the memory; and
      a control line coupled to the plurality of write inverters and the plurality of read inverters, the control line configured to activate the plurality of write inverters and the plurality of read inverters.

7. The logic device of claim 6 wherein the plurality of write inverters comprises a first portion of write inverters configured to invert a first subset of bits written to the memory and a second portion of write inverters configured to invert a second subset of bits written to the memory.

8. The logic device of claim 7 wherein the memory is integrated with the logic device.

9. The logic device of claim 6 wherein the plurality of read inverters comprises a first portion of read inverters configured to invert a first subset of bits retrieved from the memory and a second portion of read inverters configured to invert a second subset of bits retrieved from the memory.

10. The logic device of claim 6 wherein the command generating section further comprises a checker logic to check commands generated by an external logic device.

11. A command generating system utilizing command monitoring, the system comprising:
   a first processing lane comprising:
      a first memory; and a first command generating logic coupled to the first memory, the first command generating logic configured to invert data written to and read from the first memory;

a second processing lane comprising:
  a second memory; and
  a second command generating logic coupled to the second memory, the second command generating logic is configured to invert data written to and read from the second memory; second a first checker logic provided as part of the first processing land and coupled to the second memory a second checker logic provided as part of the second processing lane and coupled to the first memory;

a shared memory coupled to the first checker logic and the second checker logic; and wherein, the first checker logic is configured to invert data written to and read from the second memory and the shared memory, and the second checker logic is configured to invert data written to and read from the first memory and the shared memory.

12. The system of claim 11 wherein the first command generating logic further comprises:
  a command generating section configured to receive a common input and output a command; and
  an inverting interface section coupled to the command generating section, the inverting interface section comprising:
    a plurality of write inverters for inverting data prior to writing data to a memory;
    a plurality of read inverters for inverting data retrieved from the memory; and
    a control line coupled to the plurality of write inverters and the plurality of read inverters, the control line configured to activate the plurality of write inverters and the plurality of read inverters.

13. The system of claim 12 wherein the plurality of write inverters comprises a first portion of write inverters configured to invert a first subset of bits written to the memory and a second portion of write inverters configured to invert a second subset of bits written to the memory.

14. The system of claim 12 wherein the plurality of read inverters comprises a first portion of read inverters configured to invert a first subset of bits read from the memory and a second portion of read inverters configured to invert a second subset of bits read from the memory.

15. The system of claim 12 wherein the command generating section further comprises a checker logic to check commands generated by an external logic device.

16. The system of claim 11 wherein the shared memory is a shared buffer.

17. The system of claim 11 wherein the first command generating logic and the first memory are integrated.

18. The system of claim 11 wherein the second command generating logic and the second memory are integrated.

19. The system of claim 11 wherein the first command generating logic and the second command generating logic are operable to receive inputs from avionic systems and generate avionic commands.

* * * * *

UNITED STATES PATENT AND TRADEMARK OFFICE
CERTIFICATE OF CORRECTION

PATENT NO. : 7,565,586 B2  Page 1 of 1
APPLICATION NO. : 11/440520
DATED : July 21, 2009
INVENTOR(S) : Thompson It is certified that error appears in the above-identified patent and that said Letters Patent is hereby corrected as shown below:

Column 9, line 12, "land" should be changed to --lane--.

Signed and Sealed this

Twentieth Day of October, 2009

David J. Kappos
*Director of the United States Patent and Trademark Office*